United States Patent
Bowers et al.

(10) Patent No.: US 7,448,219 B2
(45) Date of Patent: Nov. 11, 2008

(54) HINGELESS FLAPPER VALVE FOR FLOW CONTROL

(76) Inventors: John L. Bowers, P.O. Box 15818, Long Beach, CA (US) 90815-0818; Sham S. Hariram, 25781 Terra Bella Ave., Laguna Hills, CA (US) 92653; Jayant D. Patel, 21221 Calle Olivia, Lake Forest, CA (US) 92630; Sharanpal S. Sikand, 25204 Exmoor, Mission Viejo, CA (US) 92692

( * ) Notice: Subject to any disclaimer, the term of this patent is extended or adjusted under 35 U.S.C. 154(b) by 213 days.

(21) Appl. No.: 10/872,822

(22) Filed: Jun. 21, 2004

(65) Prior Publication Data
US 2005/0279103 A1    Dec. 22, 2005

(51) Int. Cl.
F02C 6/04 (2006.01)
(52) U.S. Cl. .......................................... 60/785; 137/520
(58) Field of Classification Search ............... 60/39.83, 60/785, 226.1, 266, 782; 137/520, 521, 855
See application file for complete search history.

(56) References Cited

U.S. PATENT DOCUMENTS

| | | | | |
|---|---|---|---|---|
| 943,996 | A * | 12/1909 | Reineking | 123/585 |
| 1,429,190 | A * | 9/1922 | Coalwell | 137/520 |
| 2,022,959 | A | 12/1935 | Gordon | |
| 3,108,767 | A * | 10/1963 | Eltis et al. | 244/203 |
| 3,750,983 | A * | 8/1973 | Morris | 244/54 |
| 3,814,124 | A * | 6/1974 | Bell | 137/855 |
| 3,854,286 | A * | 12/1974 | Klees | 60/204 |
| 3,952,335 | A * | 4/1976 | Sorce et al. | 623/9 |
| 4,040,428 | A * | 8/1977 | Clifford | 128/207.16 |
| 4,199,295 | A * | 4/1980 | Raffy et al. | 415/115 |
| 4,255,083 | A * | 3/1981 | Andre et al. | 415/119 |
| 4,351,150 | A | 9/1982 | Schulze | |
| 4,504,030 | A | 3/1985 | Kniat et al. | |
| 4,538,607 | A * | 9/1985 | Saul | 128/207.16 |
| 4,662,883 | A * | 5/1987 | Bell et al. | 623/8 |
| 4,667,578 | A | 5/1987 | Hagenah | |
| 4,674,704 | A | 6/1987 | Altoz et al. | |
| 4,924,907 | A | 5/1990 | Palmer | |
| 4,930,535 | A * | 6/1990 | Rinehold | 137/15.18 |
| 5,048,288 | A * | 9/1991 | Bessette et al. | 60/226.1 |
| 5,083,581 | A * | 1/1992 | Jaw | 137/223 |
| 5,088,905 | A * | 2/1992 | Beagle | 418/55.1 |
| 5,295,478 | A * | 3/1994 | Baldwin | 128/203.11 |
| 5,662,142 | A * | 9/1997 | Ansite | 137/854 |
| 6,047,698 | A * | 4/2000 | Magidson et al. | 128/207.12 |
| 6,138,711 | A * | 10/2000 | Lung-Po | 137/527.8 |
| 6,843,643 | B2 * | 1/2005 | Fukami et al. | 417/413.1 |
| 7,114,519 | B2 * | 10/2006 | Aitchison et al. | 137/518 |
| 7,222,641 | B2 * | 5/2007 | Peric | 137/855 |

(Continued)

FOREIGN PATENT DOCUMENTS

WO    WO0202423 A1    1/2002

*Primary Examiner*—William H Rodriguez

(57) ABSTRACT

A device for controlling fluid flow for heating or cooling an associated system is provided. The present invention includes a housing having a flow control member that includes a bendable portion. The flow control member responds automatically to a pressure condition within the housing and opens or closes based on the direction and quantity of fluid flow and does not include any mechanical or electromechanical control components. The bendable portion may include, for example, a convoluted section. The flow control member is in an open position during a mode of operation of the associated system and is in a closed position in another mode of operation of the system.

25 Claims, 6 Drawing Sheets

U.S. PATENT DOCUMENTS

| | | | |
|---|---|---|---|
| 7,258,533 B2 * | 8/2007 | Tanner et al. | 417/413.2 |
| 7,306,030 B2 * | 12/2007 | Luvisotto et al. | 165/284 |
| 7,318,451 B2 * | 1/2008 | Peric et al. | 137/855 |
| 2002/0189263 A1 * | 12/2002 | Rayer et al. | 60/782 |
| 2004/0066609 A1 | 4/2004 | Loy et al. | |
| 2004/0094157 A1 | 5/2004 | Dantanarayana et al. | |
| 2004/0118105 A1 | 6/2004 | Aitchison et al. | |
| 2004/0250863 A1 * | 12/2004 | Atkeson et al. | 137/855 |
| 2006/0237079 A1 * | 10/2006 | Cheadle et al. | 137/855 |

* cited by examiner

HINGELESS FLAPPER VALVE FOR FLOW CONTROL

FIELD OF THE INVENTION

This invention relates to flow control and, more specifically, to flow control in dynamic temperature environments.

BACKGROUND OF THE INVENTION

In certain type of jet engines, Engine Electronic Controls (EEC) units fail at an unusually high rate. Failures of these EECs are caused by the thermal cycling that occurs in a typical flight evolution. Presently, the EEC is cooled on the ground by natural convection when the jet engine is off. When the engine is on while on the ground, at takeoff power or climb, cooling air is drawn through the EEC and into the engine by low pressure produced at the engine inlet. When at altitude, the flow is from the engine inlet into the EEC due to pressure changes. Thus, a typical EEC may experience in a single flight a range of temperatures between minus 60° C. and plus 95° C. Because of the extreme differences in these operating temperatures, thermal expansion and contraction of the electronic components within the EEC occurs, thereby leading to thermal fatigue and failure. When failure occurs, the engine may be shut down. In the air, this is critical and the aircraft must land at the nearest airport. On the ground, the engine must be shut down and engine maintenance must occur. Both of these shutdown situations are very costly to both the airlines and the engine/aircraft manufacturers due to guarantees. In-flight shutdown typically costs thousands of dollars due to an aircraft having to land at a non-destination airport, and a back-up aircraft having to be called or other form of transportation arranged for the passengers. There are also the unmeasurable costs associated with adversely affecting the travel plans of all the occupants of the aircraft.

In situations when an on-ground engine shutdown occurs, departure is delayed trying to resolve the problem. This can be very costly if the EEC has to be replaced. Also, the time it takes to perform the maintenance or find a new aircraft also costs a great amount of money for the airlines as well as adding to unmeasurable cost of passenger delay.

Therefore, there exists a need to reduce the amount of thermal cycling that can occur in various machinery, including, for example, aircraft EEC units.

SUMMARY OF THE INVENTION

The present invention provides a device for controlling fluid flow for heating or cooling an associated system. The present invention includes a hingeless valve that opens or closes based on the direction and quantity of fluid flow, and does not include any mechanical or electromechanical control components.

In one embodiment, the device includes a housing and a flapper door coupled to the housing, the flapper door having a bendable portion. The flapper door is in an open position during a some modes of operation of the associated system, and is in a closed position in other modes of operation of the system. In the second position, the flapper door closes off material flow through the housing.

In one aspect of the invention, the device is coupled to an engine electronic control (EEC) unit of an aircraft. The second nozzle is connected to the EEC unit and the first nozzle is connected to a cooling duct. The cooling duct is connected to an inlet for an engine.

In another aspect of the invention, the flapper door is in one position during the ground aircraft operation, takeoff and climb engine operations, and is in another position during altitude and cruise engine operation.

BRIEF DESCRIPTION OF THE DRAWINGS

The preferred and alternative embodiments of the present invention are described in detail below with reference to the following drawings.

DETAILED DESCRIPTION OF THE INVENTION

The present invention relates to flow control assemblies. Many specific details of certain embodiments of the invention are set forth in the following description and in FIGS. 1-7 to provide a thorough understanding of such embodiments. One skilled in the art, however, will understand that the present invention may have additional embodiments, or that the present invention may be practiced without several of the details described in the following description.

Figure 1:
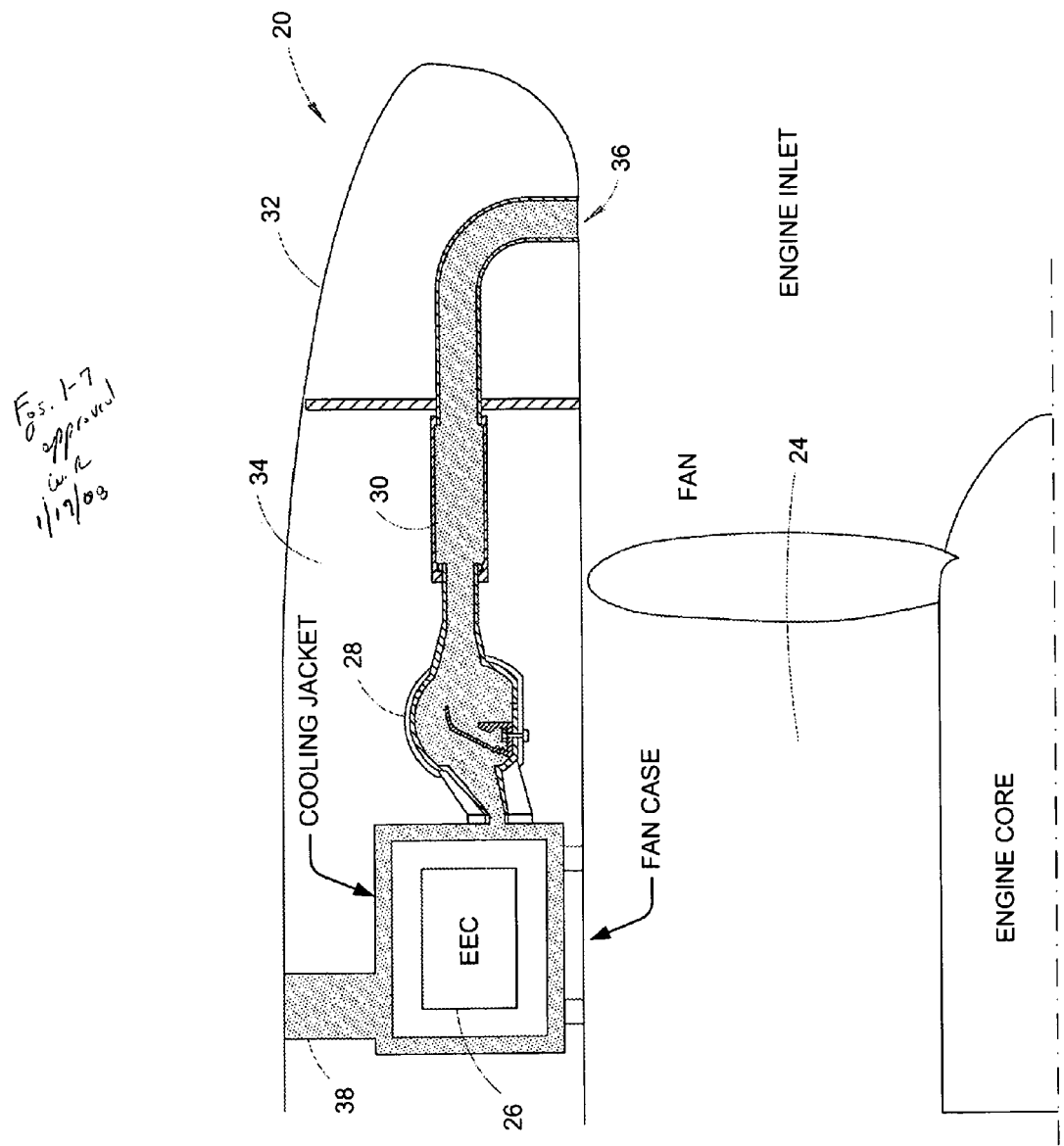
FIG. 1 illustrates an example partial side view of an engine system formed in accordance with an embodiment of the present invention.

An example of machinery that can benefit from the present invention is an engine system 20, as shown in FIG. 1. The engine system 20 includes a jet engine 24, an engine electronic control (EEC) unit 26, a valve 28, and a cooling duct 30, all of which are mounted within an engine compartment 34 surrounded by a cowling 32. In one embodiment, the EEC unit 26 is mounted on top of the engine 24. The valve 28 is connected to a cooling inlet port (not shown) of the EEC unit 26. The cooling duct 30 is coupled to the valve 28 and extends to a static port 36 at the air intake end of the engine 24.

The valve 28 lets cooling air flow through the EEC unit 26 during certain modes of operation and restricts cooling air flow during other modes of operation, as described more fully below.

In a first mode of operation, the EEC unit 26 is turned on and the engine 24 is off (e.g. on the ground prior to takeoff), and natural convection of the EEC unit 26 occurs. The heat produced by the EEC unit 26 causes heated air to pass through a chimney 38 of the EEC unit 26, thereby drawing air through the cooling duct 30 and the valve 28. In a second mode of operation, the engine 24 is operating and producing a pressure level at the nozzle end of the duct 30 that causes air to be sucked into the chimney 38, thus passing through the EEC unit 26 to the valve 28 and out the port 36 of the duct 30. The second mode of operation includes, for example, ground idle, taxi, takeoff, and climb.

At a third mode of operation, the aircraft is at altitude or in a cruise mode. In this mode of operation, a pressure build-up at the intake of the engine 24 forces air through the duct 30 to the valve 28, causing the valve 28 to close and prevent cooling air from passing through the EEC unit 26.

Figure 2:
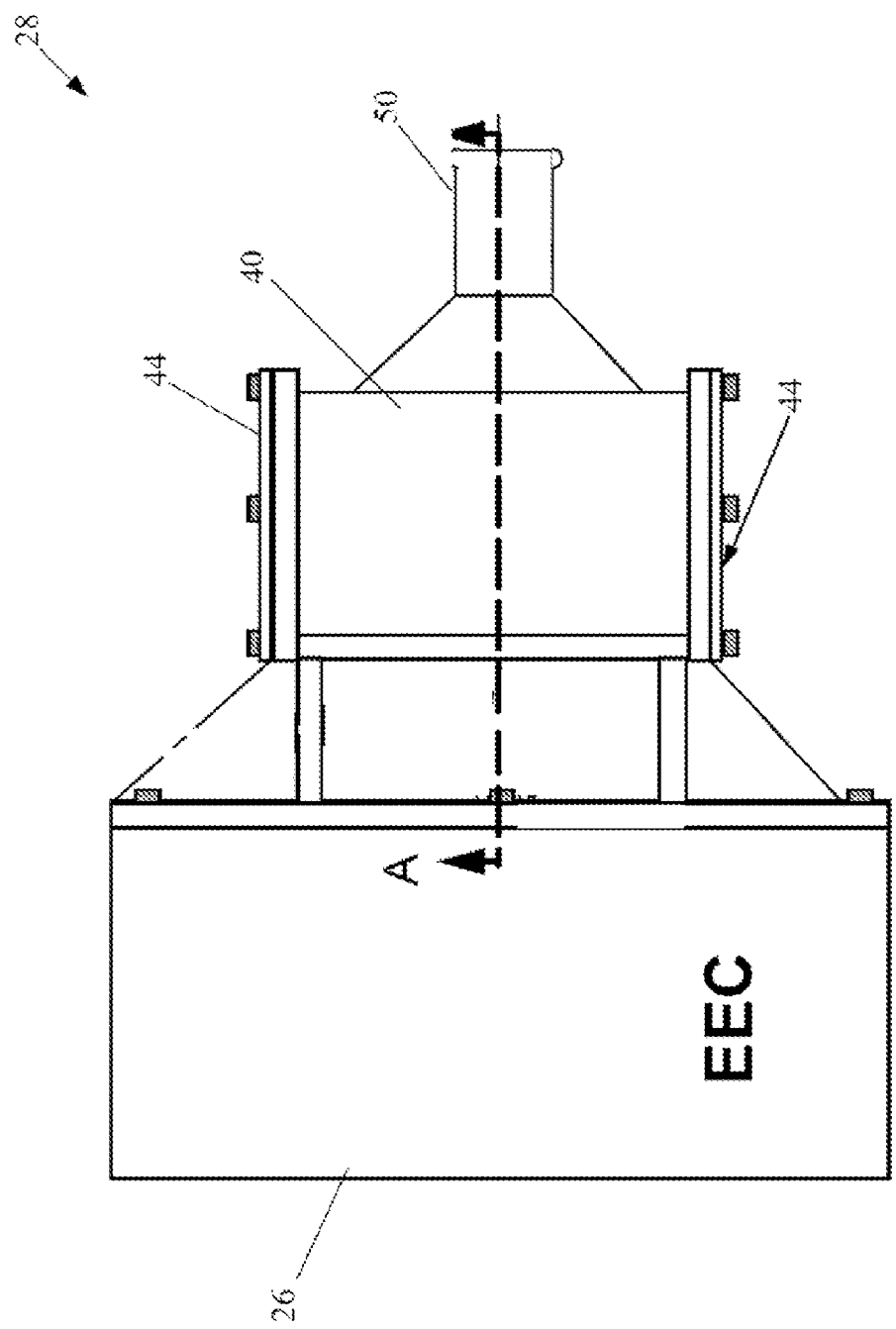
FIG. 2 illustrates a top view of an exemplary valve formed in accordance with an embodiment of the present invention.
Figure 3:
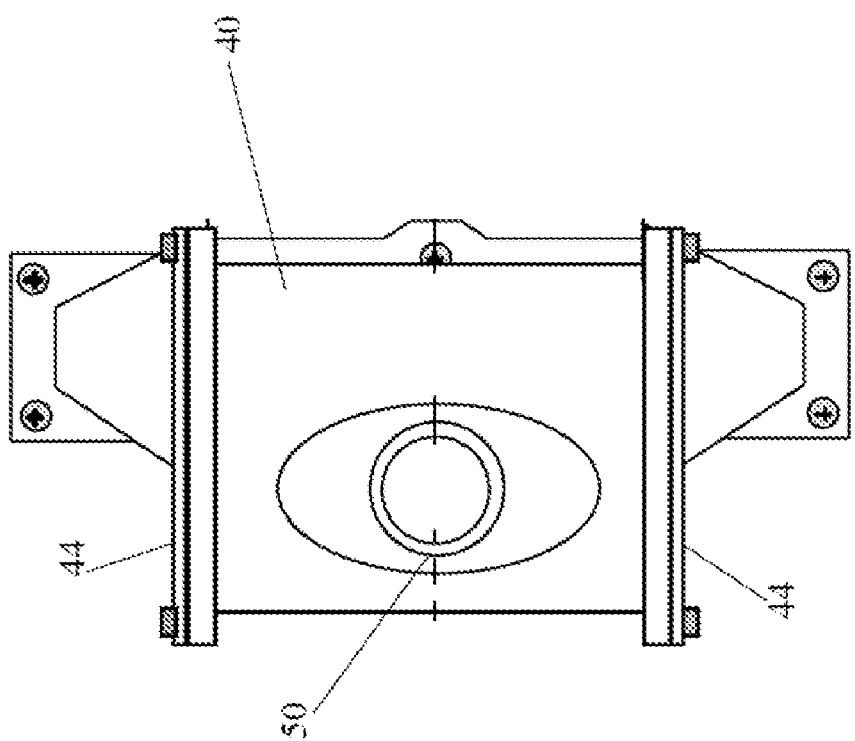
FIG. 3 illustrates a front view of the valve shown in FIG. 2.

FIGS. 2-5 illustrate various views of an embodiment of the valve 28. As shown in FIGS. 2 and 3, the valve 28 includes a housing 40. The housing 40 includes a nozzle 50 at each end with sides or side panels 44 that are mounted to opposing sides of a housing 40. The side panels 44 preferably are clear windows that allow maintenance personnel to perform visual analysis of the inner components. The panels 44 may be opaque material or a clear material, such as high-tempered glass, polycarbonate, polyphenyl or other clear material having heat resistive properties, such as Radel®, Ultan®, or Lexan®. The panels 44 may be attached to the sides of the housing 40 by bolt mechanisms with a gasket mounted in between or are pre-coated with silicone or some other bonding agent and then bonded to the side of the housing 40. The panels 44 may be replaced by a permanent wall structure or may be integral into the housing 40.

Because the present invention does not include a conventional hinge, the valve 28 is less susceptible to fatigue due to high vibration levels.

Figure 4:
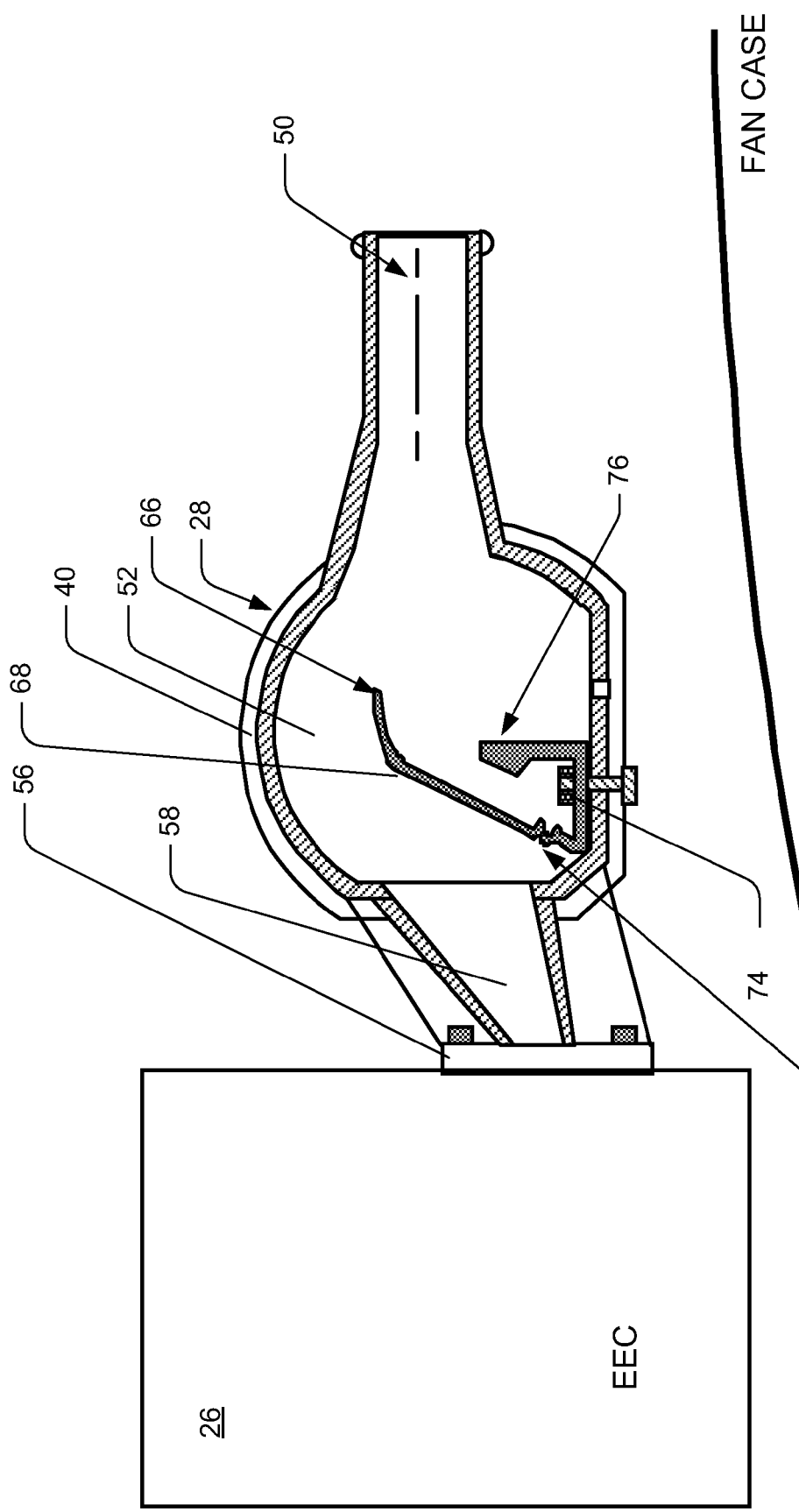
FIGS. 4 and 5 illustrate cut-away side views of the valve shown in FIGS. 2 and 3 at two different stages of operation.

FIG. 4 illustrates a cross-sectional view of the housing 40. The nozzle 50 receives the cooling duct 30 (FIG. 1). The nozzle 50 expands in diameter to an inner chamber 52. At a second end of the valve 28 is a flange 56 and a tapered chamber 58 that is located between the inner chamber 52 and an opening within the flange 56. The flange 56 is fastened by either bolts or some other fastening mechanism to an air intake portal (not shown) of the EEC unit 26. An upper portion of the inner housing 52 is formed by a curved wall. A bottom portion of the inner cavity 52 is formed by a substantially flat base. The walls of the cavity 52 connect the nozzle 50 and the tapered cavity 58.

Mounted within the inner housing 52 is a flapper 66. In one embodiment, the flapper 66 is substantially U-shaped and includes a first flapper section 68 coupled to a bendable portion 70. In this embodiment, the bendable portion 70 includes a convoluted device. The bendable portion 70 is attached to a base section 74 and the base section 74 is connected to a stopper section 76. The bendable portion 70 allows the flapper section 68 to move between the stopper section 76 to being seated between the base of the inner cavity 52 and the tapered cavity 58, thereby blocking airflow between the inner cavity 52 and the tapered cavity 58. The base section 74 is attached to the base wall of the inner cavity 52 by a fastening method or by a bolt mechanism.

In a presently preferred embodiment, the flapper 66 is formed of a material that provides negligible hysteresis and can operate at extreme temperatures. In one embodiment, the valve material is a silicon coated fiberglass material, such as a multi-layered silicon treated fiberglass cloth. The sections of the flapper 66 exhibit different levels of flexibility. For example, the bendable portion 70 must have a certain level of flexibility while the stopper section 76 and base section 74 require a greater degree of stiffness. Various hardeners, such as resins, may be added to portions of the flapper 66 in order to provide greater stiffness. The flapper 66 may be manufactured by layering together long sheets of silicone coated fiberglass, placing the sheets in a mold, and curing the sheets under pressure and temperature in order to form the flapper 66 as desired. The sheets may be cut before or after molding. The bendable portion 70 and the weight of the flapper section 68 are adjusted in order for the flapper section 68 to be opened and closed at the proper times of operation.

FIG. 4 illustrates an approximate position of the flapper 66 during the first and second modes of aircraft operation described above. In other words, the flapper section 68 is open or is resting on the stopper section 76, thereby allowing airflow to pass in either direction through the valve 28.

Figure 5:
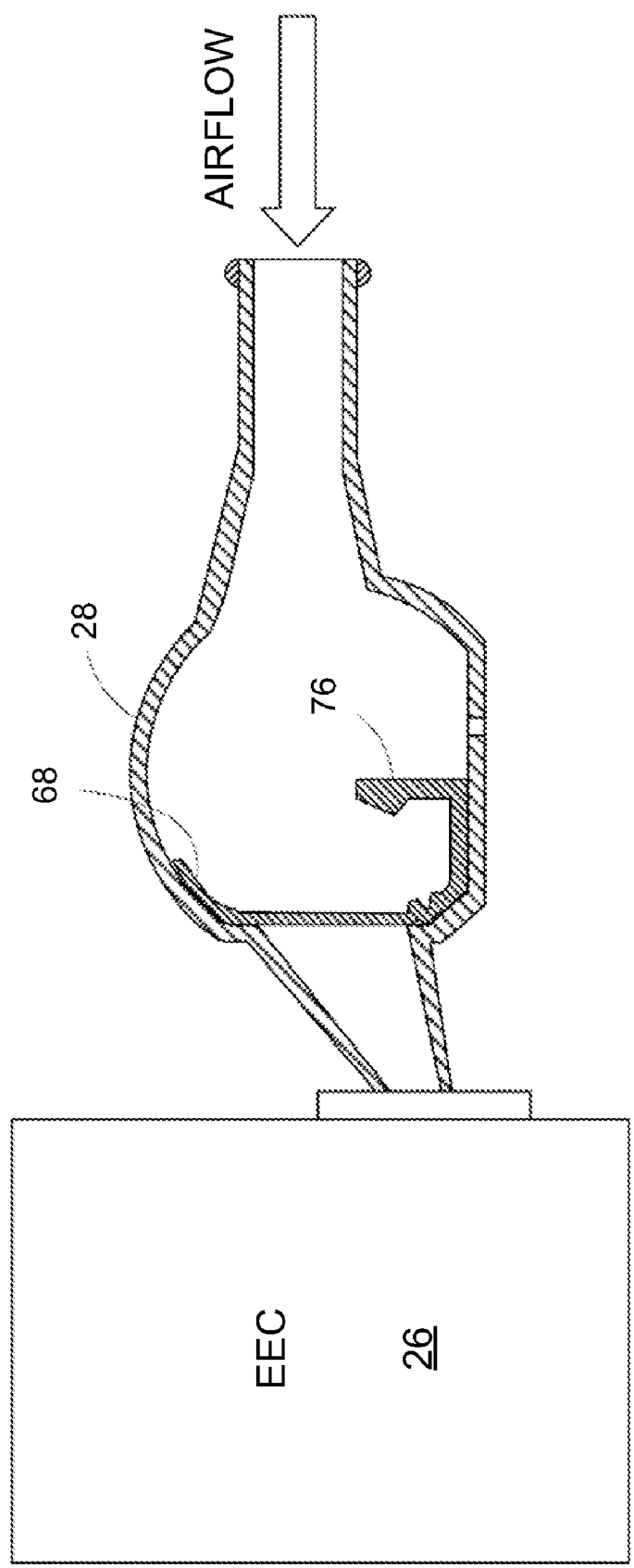
Figure 6:
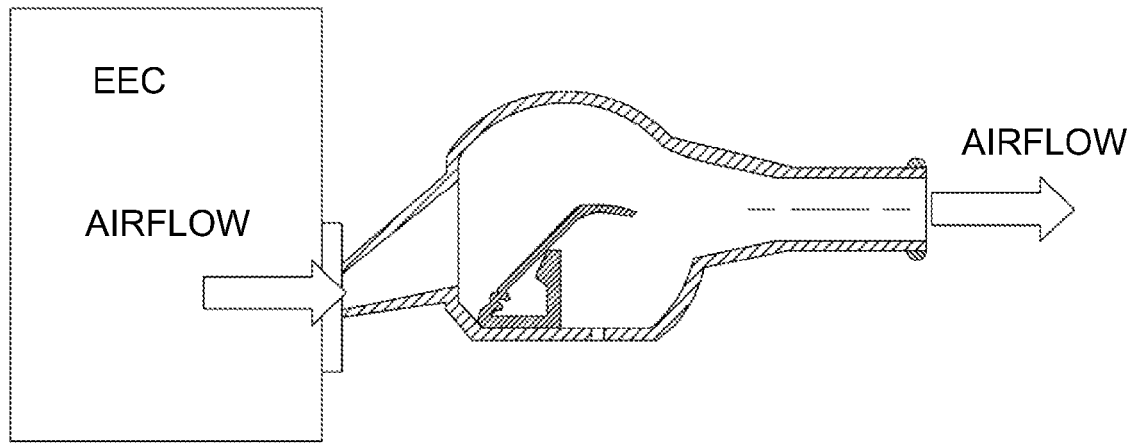
FIGS. 6 and 7 show valve positions during different modes of operation in accordance with an embodiment of the invention.
Figure 7:
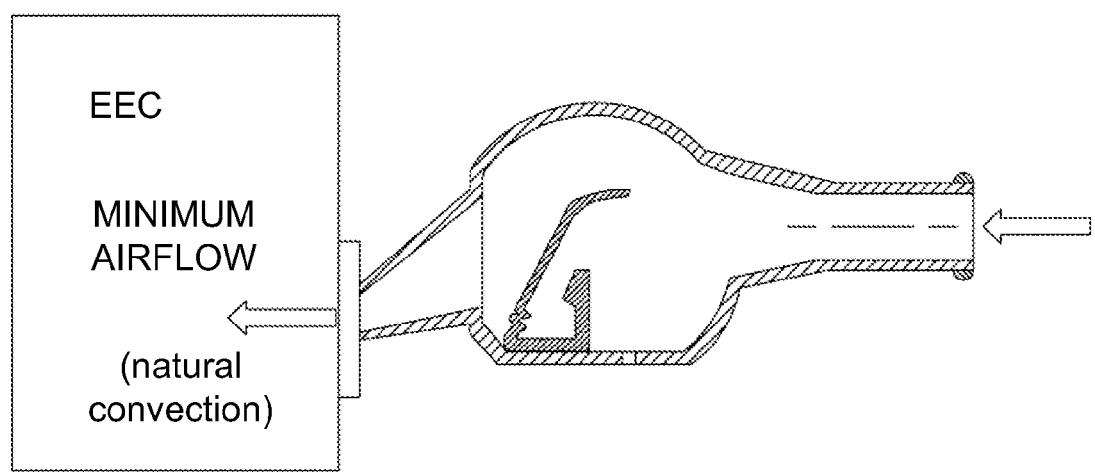

FIG. 5 illustrates a position of the flapper section 68 during the third mode of aircraft operation. FIG. 6 illustrates the flapper 66 in a full open position. FIG. 7 illustrates the flapper 66 in a neutral position. As best shown in FIG. 5, in the third mode of operation, a threshold amount of airflow received by the nozzle 50 forces the flapper section 68 to a closed position. In one embodiment, the flapper section 68 is aerodynamically curved at an end in order to catch or release the proper amount of air, thus opening or closing at desired times. It will be appreciated that the flapper section 68 advantageously moves automatically in response to pressure differentials through the housing 40 during various modes of operation. Therefore, unlike conventional hinged valves, there is no need for control mechanisms to control the position of the flapper section 68.

The flapper 66 may be mounted within the inner chamber 52 such that the fail safe position is an open position. Thus, if the flapper 66 fails, the airflow through the valve device 28 will preferably not be blocked.

While preferred and alternate embodiments of the invention have been illustrated and described, as noted above, many changes can be made without departing from the spirit and scope of the invention. Accordingly, the scope of the invention is not limited by the disclosure of these preferred and alternate embodiments. Instead, the invention should be determined entirely by reference to the claims that follow.

What is claimed is:

1. A flow control device for controlling fluid flow relative to a system, the device comprising:
   a housing having first and second openings; and
   a flapper member disposed within the housing, the flapper member including a flow control member having a bendable portion that includes a convoluted section,
   the convoluted section enabling the flow control member to allow flow through the housing from the first opening to the second opening during a first mode of operation of the system, and allow flow through the housing from the second opening to the first opening during a second mode of operation of the system.

2. The device of claim 1, wherein
   the convoluted section further enables the flow control member to close off flow between the first and second openings during a third mode of operation of the system.

3. The device of claim 2, wherein the device is coupled to an engine electronic controls (EEC) unit.

4. The device of claim 3, wherein the second opening is connected to the EEC unit and the first opening is connected to a cooling duct.

5. The device of claim 4, wherein the cooling duct is connected to an inlet for an engine.

6. The device of claim 1, wherein the device is coupled to an engine electronic controls (EEC) unit and the system is an aircraft engine, the first mode of operation includes EEC operation during engine non-operation, the second mode of operation includes at least one of ground engine operation and climb engine operation, and the third mode of operation includes cruise engine operation.

7. The device of claim 1, wherein the housing includes at least one viewing window.

8. An engine system comprising:
   an engine;
   an air duct;
   a valve component coupled to the air duct; and
   electronic engine controls (EEC) coupled to the valve component,
   wherein the valve component includes a flow control member having a bendable portion, the flow control member being moveable between a first position to allow airflow through the EEC unit during a first mode of engine operation and a second position to inhibit airflow through the EEC unit during a second mode of engine operation.

9. The system of claim 8, wherein the valve component comprises:
   a housing having first and second openings, the flow control member being disposed within the housing; and
   first and second nozzles coupled to the first and second openings, respectively, and wherein the flow control member is configured to close off air flow between the first and second nozzles.

10. The system of claim 9, wherein the second nozzle is connected to the EEC unit and the first nozzle is connected to the air duct.

11. The system of claim 10, wherein the air duct is connected to an air inlet section of the engine.

12. The system of claim 8, wherein the engine is an aircraft engine, the first mode of operation includes at least one of ground aircraft operation and climb engine operation, and the second mode of operation includes cruise engine operation.

13. The system of claim 8, wherein the valve component further comprises:
   a housing for containing the flow control member; and
   one or more viewing windows attached to the housing for viewing the flow control member,
   wherein the flow control member is connected to the housing.

14. The system of claim 13, wherein the viewing windows include at least one of polycarbonate or polyphenyl materials.

15. A flow control method, comprising:
   providing a housing having first and second openings and having a flow control member disposed within the housing, the flow control member including a bendable portion having a convoluted device;
   creating a first pressure condition within the housing to bendably position the flow control member in a first position that allows flow through the housing from the first opening to the second opening; and
   creating a second pressure condition within the housing to bendably position the flow control member in a second position that allows flow through the housing from the second opening to the first opening.

16. The method of claim 15, wherein the first pressure condition includes electronic engine controls (EEC) operation during engine non-operation, and the second pressure condition includes at least one of ground engine operation and climb engine operation.

17. The method of claim 15, wherein providing a housing includes providing a housing having one or more viewing windows for viewing the flow control member.

18. The method of claim 15, further comprising:
   creating a third pressure condition within the housing to bendably position the flow control member in a third position that inhibits flow through the housing, the third pressure condition includes cruise engine operation.

19. A flow control device for controlling fluid flow relative to a system, the device comprising:
   a housing having first and second openings; and
   a flapper member disposed within the housing, the flapper member including a flow control member having a bendable portion,
   wherein the flow control member is in an open position to allow flow through the housing during a first mode of operation of the system, and is in a closed position to inhibit flow through the housing in a second mode of operation of the system, and wherein the device is coupled to an engine electronic controls (EEC) unit.

20. The device of claim 19, wherein the flow control device further comprising:
   first and second nozzles coupled to the first and second openings of the housing, wherein the flow control member is configured to close off material flow between the first and second nozzles.

21. The device of claim 20, wherein the second nozzle is connected to the EEC unit and the first nozzle is connected to a cooling duct.

22. The device of claim 21, wherein the cooling duct is connected to an inlet for an engine.

23. The device of claim 19, wherein the system is an aircraft engine, the first mode of operation includes at least one of ground aircraft operation and climb engine operation, and the second mode of operation includes cruise engine operation.

24. The device of claim 19, wherein the bendable portion includes a convoluted section.

25. The device of claim 19, wherein the housing includes at least one viewing window.

* * * * *

UNITED STATES PATENT AND TRADEMARK OFFICE
CERTIFICATE OF CORRECTION

PATENT NO. : 7,448,219 B2
APPLICATION NO. : 10/872822
DATED : November 11, 2008
INVENTOR(S) : John L. Bowers et al.

It is certified that error appears in the above-identified patent and that said Letters Patent is hereby corrected as shown below:

The Title Page Item [73] of the above-identified patent should state the name of the assignee.

The Boeing Company
Residence: Chicago, IL

Signed and Sealed this

Seventeenth Day of March, 2009

JOHN DOLL
*Acting Director of the United States Patent and Trademark Office*